United States Patent
Smith et al.

(10) Patent No.: US 6,186,804 B1
(45) Date of Patent: Feb. 13, 2001

(54) MOUNTING AND TESTING OF ELECTRICAL DEVICES USING A LEVER OPERATED BAY FOR RECEIVING THE ELECTRICAL DEVICES

(75) Inventors: David J. Smith, West Wellow; George A. Cunningham, Emsworth, both of (GB); Gianluca Elmo, Bologna (IT)

(73) Assignee: Havant International Limited, Hampshire (GB)

( * ) Notice: Under 35 U.S.C. 154(b), the term of this patent shall be extended for 0 days.

(21) Appl. No.: 09/344,487

(22) Filed: Jun. 25, 1999

(30) Foreign Application Priority Data

Jun. 29, 1998 (GB) .................................................. 9814073

(51) Int. Cl.[7] .................................................. H01R 13/62
(52) U.S. Cl. ........................................ 439/157; 439/928.1
(58) Field of Search ................................ 439/157, 928.1, 439/364; 360/99.06, 97.01; 361/685, 686, 727, 754

(56) References Cited

U.S. PATENT DOCUMENTS

| | | |
|---|---|---|
| 4,979,909 | 12/1990 | Andrews . |
| 4,982,303 | 1/1991 | Krenz . |
| 5,010,426 | 4/1991 | Krenz . |
| 5,237,473 | 8/1993 | Yoshida . |
| 5,269,698 * | 12/1993 | Singer .................................. 439/157 |
| 5,325,263 * | 6/1994 | Singer et al. ........................ 361/685 |
| 5,325,264 | 6/1994 | Kirk et al. . |
| 5,340,340 | 8/1994 | Hastings et al. . |
| 5,518,412 * | 5/1996 | Larabell .............................. 439/157 |
| 6,008,984 * | 12/1999 | Cunningham et al. .............. 361/685 |

* cited by examiner

Primary Examiner—Khiem Nguyen
Assistant Examiner—Hae Moon Hyeon
(74) Attorney, Agent, or Firm—Pillsbury Madison & Sutro LLP

(57) ABSTRACT

A bay for receiving an electrical device such as a disc drive is designed for easy insertion and ejection of the drive. The bay, a sliding carriage bearing a forwardly facing ejection member having a forwardly facing ejection pin for passing on the rear of the electrical device, and a lever operated insertion and removal mechanism for the insertion and later removal of said electrical device, including a pivoted lever having a manually engageable handle, a roller carried by the lever for engagement with the forward face of the electrical device, and a quadrant gear coupled to a rack on the sliding carriage, whereby said lever is pivotable to drive the sliding carriage backwards and forwards in the bay by the action of the quandrant gear and rack to carry the elecrical device into and out of the bay.

12 Claims, 6 Drawing Sheets

MOUNTING AND TESTING OF ELECTRICAL DEVICES USING A LEVER OPERATED BAY FOR RECEIVING THE ELECTRICAL DEVICES

BACKGROUND OF THE INVENTION

The present invention relates to the mounting and testing of electrical devices, particularly computer disc drives, and provides a bay for the temporary reception and connection of such electrical devices facilitating their testing.

Disc drive testers require multiple test bays, up to 120 per test apparatus. Each test bay or fixture is designed to load, clamp and electrically connect a disc drive ready for testing. After the test process, the drive needs to be ejected and removed by the operator to be replaced by the next drive to be tested.

Conventionally, disc drives have been manually pushed into the bays of test apparatus and have been manually removed. However, different approaches to the problem have been explored including the use of a mechanical lever to drive a sliding carriage to unplug the drive for removal and in some cases to drive such a carriage engaging the drive over the last part of its motion to insert and plug in a drive.

In most cases, it is necessary to provide means for retaining the disc drive during the test. Unfortunately, different drives have required different retention devices to suit their individual design and there remains a need for a general purpose, easy to use test bay that is able to provide both mechanical assistance for the insertion and removal of the drive. There is also a need for test bays providing improved means for retaining drives for testing.

The problems addressed by the invention are not however limited to the testing of computer disc drives but arise in other contexts also.

BRIEF SUMMARY OF THE INVENTION

The present invention provides a bay for receiving an electrical device having a rearwardly facing electrical connector, a rearwardly facing abutment surface, and a forwardly facing abutment surface, said bay comprising a front aperture for receiving a said electrical device, a rear portion having an electrical connector adapted to connect to the electrical connector of said electrical device, a sliding carriage bearing an ejection member having a forwardly facing abutment surface for engagement with the rearwardly facing abutment surface of the electrical device, a mechanism mounting said carriage for sliding movement in the bay, and a lever operated insertion and removal mechanism for the insertion and later removal of said electrical device, said mechanism comprising a pivoted lever having a manually engageable actuating portion, an abutment member carried by the lever for engagement with the forwardly facing abutment surface of the electrical device, and a rotary gear member driven by said lever and operatively coupled to the sliding carriage, whereby said lever is pivotable from a first position in which said front aperture of the bay is open for receiving a said electrical device and said carriage is slid forwardly, via intermediate positions in which said carriage and said ejection member are driven progressively rearwardly by the action of said rotary gear member and the abutment member of the lever bears against the front abutment surface of the electrical device to push said device into said bay, to a second position in which said carriage is driven fully rearwardly and said device is brought to a position in the bay where the electrical connector of the device connects to the electrical connector of the bay, and whereby the electrical device can be ejected from the bay by reversal of the movement of said lever from said second position to said first position to drive said carriage forwards in the bay with said ejection member bearing against the rearwardly facing abutment surface of the device to drive the device out of the bay.

Preferably, the abutment surface of the lever is provided on a roller mounted for rotation on said lever. The use of a roller provides a low friction interface between the front of the disc drive and the abutment of the lever which bears upon it.

Preferably, the rotary gear member driven by said lever is in engagement with a toothed rack on said carriage. Pivoting movement of the lever is thereby enabled to drive sliding movement of the carriage. Preferably there is a detent mechanism acting to retain the lever in its second position. This may for instance be provided by a dog on the lever engaging a sprung catch mounted fixed in the bay when the lever reaches its second position. The mechanism for retaining the electrical device in the bay preferably acts on the lever rather than on the electrical device directly, thus reducing or removing dependence on the design of the electrical device in the successful performance of the retention mechanism.

The distance between the abutment surface of the lever and the pivot of the lever may be constant. It will then dictate the amount by which the abutment surface of the lever displaces the drive into the bay as the lever is pivoted. The track followed by the abutment surface of the lever will then be a part circle.

However, the mechanism provided may act for shortening the distance from the abutment surface of the lever to its pivot progressively as the lever is moved from the first position to the second position.

To this end, the lever may comprise a first portion which is mounted for said pivoting movement and a second portion carried by the first portion for movements, e.g. sliding movement, with respect thereto so as to extend and contract said lever and bearing a cam follower and wherein the bay comprises a fixed cam engaged with said cam follower, the cam being shaped such that in said first position, the lever is extended and when moved through said intermediate positions to said second position the second portion of the lever is constrained to move with respect to the first portion to progressively contract said lever.

In an alternative arrangement, the lever is pivoted on the sliding carriage, a toothed rack is provided which is fixed with respect to the electrical connector of the bay and said rotary gear member is rotated by said lever and is in geared engagement with said rack such that pivoting of said lever from said first position to said second position drives said carriage toward the back of said bay. The gearing between the lever and the rack may be such as to produce a greater movement of the carriage towards the back of the bay for a given angle of displacement of the lever than would be obtained if the gear mounted on the lever were in direct engagement with the rack.

The invention includes apparatus for testing an electrical device comprising a bay as described above, preferably at least 10 said bays, e.g. more than 50 said bays. The invention includes also a method of testing the operation of a computer disc drive comprising inserting the drive into the or a bay of such apparatus and conducting electronic tests on the drive.

BRIEF DESCRIPTION OF THE DRAWINGS

The invention will be further described and illustrated with reference to the accompanying drawings in which.

DETAILED DESCRIPTION OF THE INVENTION

Figure 1:
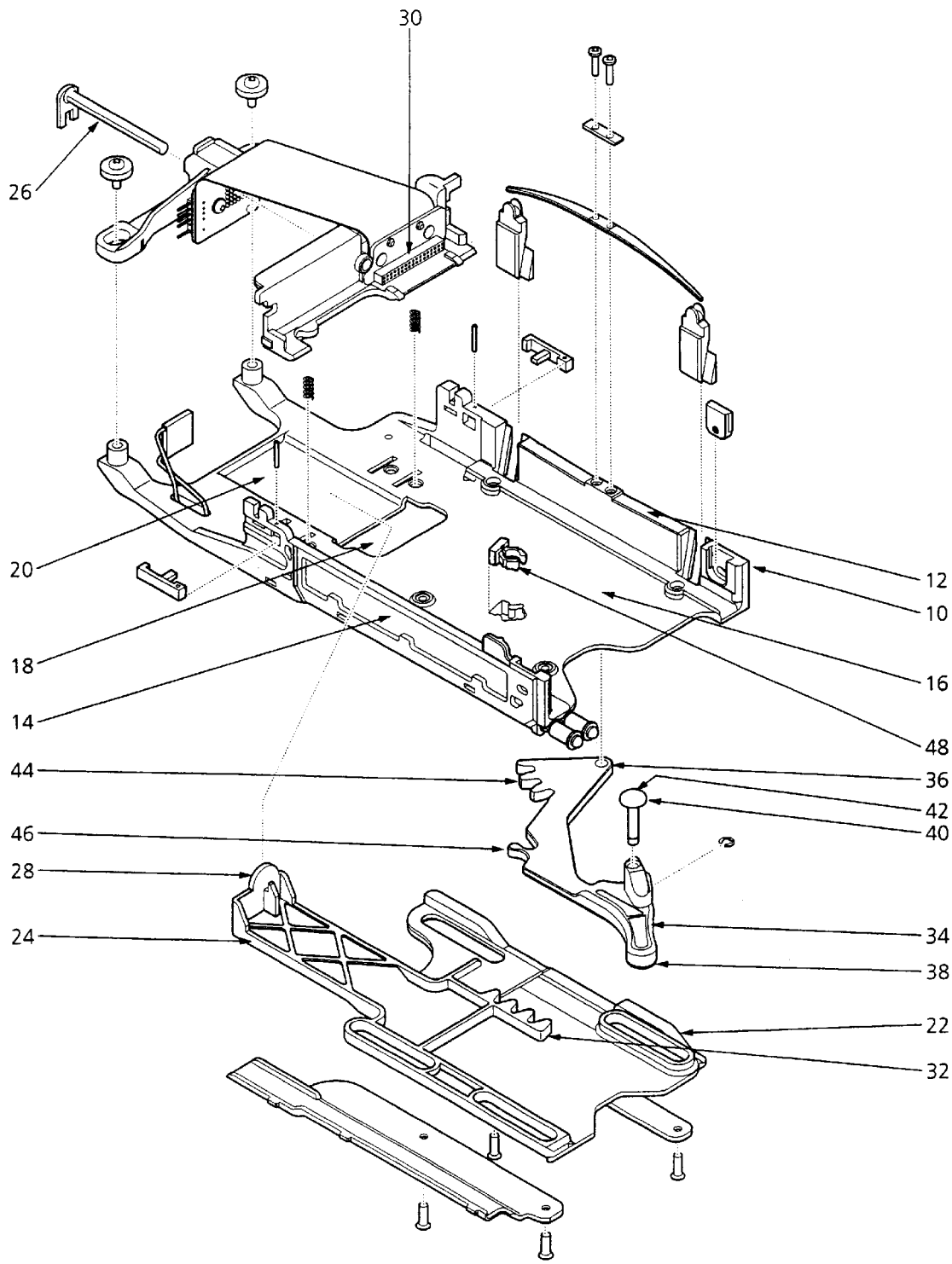
FIG. 1 is an exploded view of a first embodiment of a test bay according to the invention.
Figure 6:
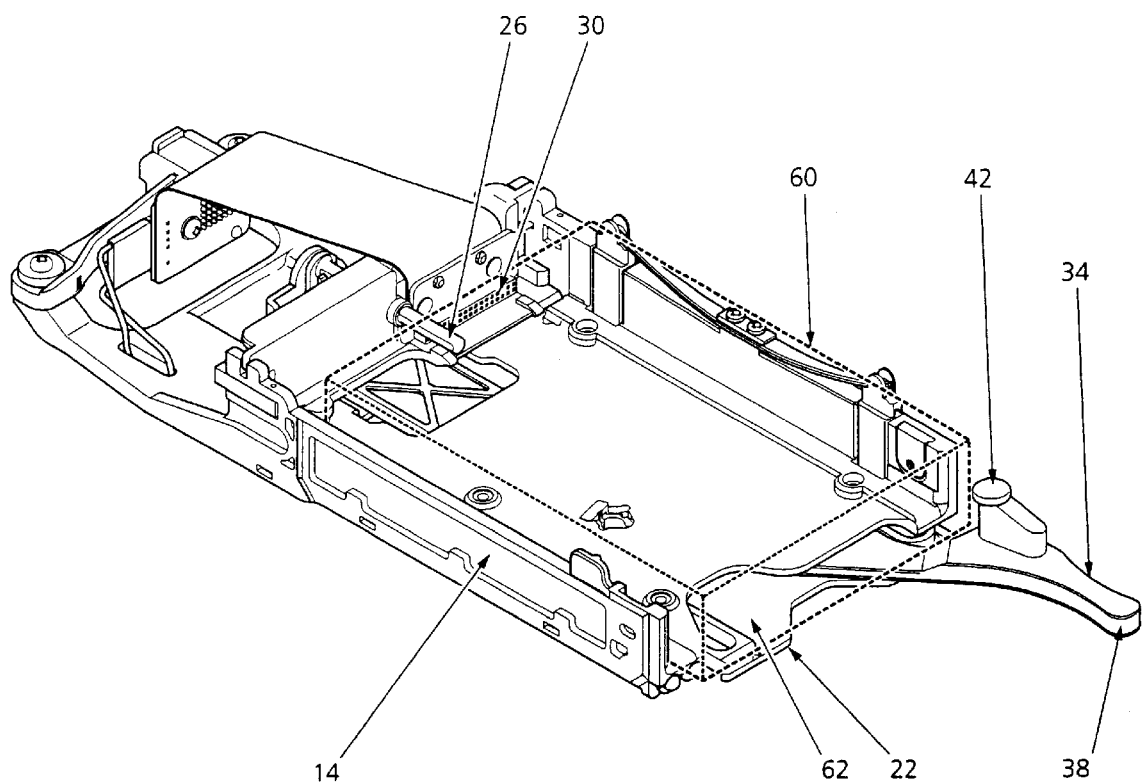
FIG. 6 illustrates the test bay of FIG. 1 in an assembled condition as a disc drive is inserted.
Figure 7:
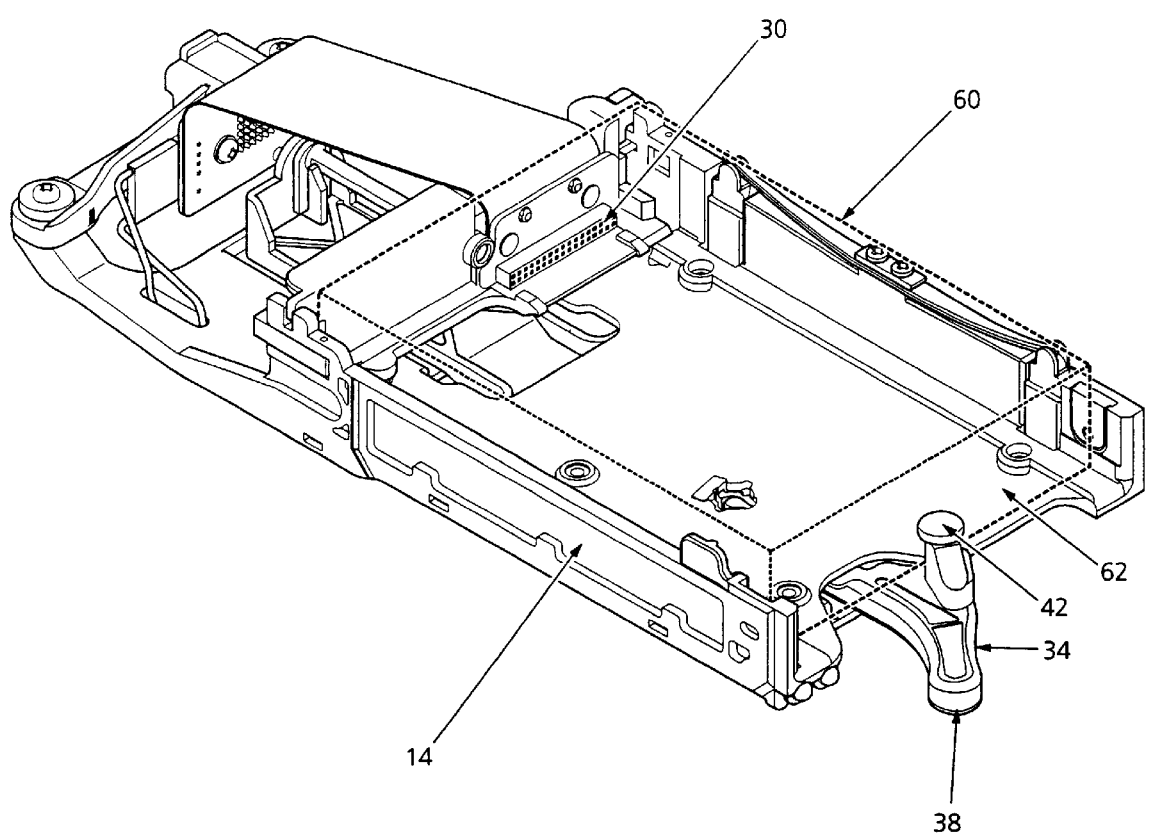
FIG. 7 illustrates the test bay of FIG. 6 with the disc drive in a loaded condition.

As shown in FIG. 1, FIG. 6 and FIG. 7 a test bay for a computer disc drive test apparatus comprises a fixed tray 10 defining the main structure of the bay. The tray 10 has side walls 12 and 14 and a floor 16. There is an aperture 18 in the floor 16 and a portion 20 of the floor 16 behind the aperture 18 is depressed below the plane of the front portion of the floor 16.

A sliding carriage 22 is mounted to slide below the floor 16 of the tray 10 and has a rearwardly extending tongue 24 which passes through the aperture 18 and slides over the top surface of the depressed portion 20 of the tray floor 16. An ejector pin 26 is mounted on an upstanding rear wall 28 of the tongue 24 and projects from there forwardly within the tray 10. An electrical connector 30 is provided at the back of the tray 10. The sliding carriage 22 has a toothed rack 32 on its upper surface. A bell-crank lever 34 is pivoted on the tray 10 about an axis 36. An actuating portion of the lever 34 is formed by a manually engageable handle 38. The lever 34 carries a roller 40 having a head 42 for engaging the front surface of a disc drive 60 in use, as shown in FIG. 7. The roller 40 is mounted for rotation on the lever 34. A toothed formation at the other end of the lever 34 forms a quadrant gear 44 which is in engagement with the rack 32 of the sliding carriage. A dog 46 having an enlarged head protrudes rearwardly in the bay from an intermediate portion of the lever 34. A corresponding sprung detent 48 having a pair of sprung arms for receiving the dog 46 is provided on the upper surface of the tray floor 16.

When the lever 34 is swung as far as possible to the right in the drawing the sliding carriage 22 is driven forwardly in the bay by the engagement of the quadrant gear 44 and the toothed rack 32 and the front of the tray 10 is accessible as an aperture into which a disc drive 60 can be inserted such that before resistance is felt the front of the disc drive 60 is clear of the roller 40. When the lever 34 is swung towards the left of the drawing the head 42 of roller 40 bears on the front 62 of the disc drive and pushes the disc drive 60 into the bay, as shown in FIG. 6. At the same time, the engagement of the quadrant gear 44 and the toothed rack 32 drives the sliding carriage 22 rearwardly in the bay carrying the ejection pin 26 away from the disc drive as it moves into the bay. When the lever 34 is fully in its second position to the left of the drawing the dog 46 latches into the detent 48 and the electrical connector at the back of the disc drive mates with electrical connector 30 in the bay.

After testing has been completed, the operator ejects the drive from the bay by moving the lever 34 fully to the right-hand side of the drawing, i.e. back to its first position. As the roller releases the front surface of the disc drive the sliding carriage 22 is driven forwardly in the bay by the engagement of the toothed rack 32 with the quadrant gear 44 and this brings the ejection pin 26 forwardly in the bay to push out the disc drive to a position to which it can easily be manually withdrawn.

Figure 2:
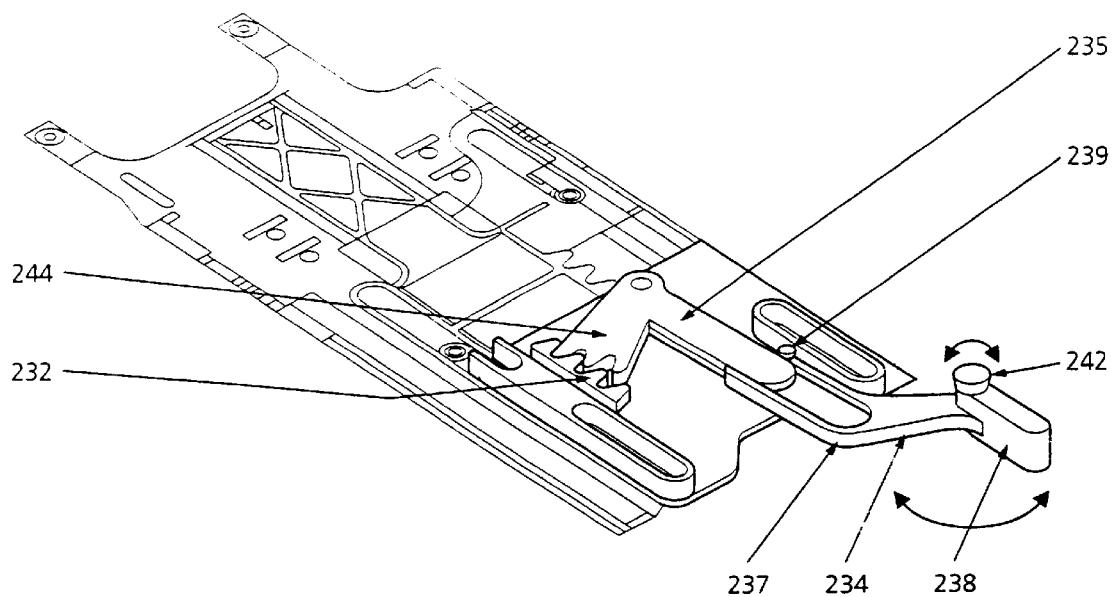
FIG. 2 shows components of a second embodiment of a test bay according to the invention.

In this embodiment, the distance towards the rear of the bay moved by the roller 40 is dictated simply by the distance between the roller 40 and the pivot axis 36, the roller 40 moving over part of a circle around this pivot axis. In some cases it may be desirable to provide for a greater front to back displacement of the roller for a given swinging angle of the lever. This can be arranged by the modifications to the lever illustrated in FIGS. 2 and 3.

Figure 3:
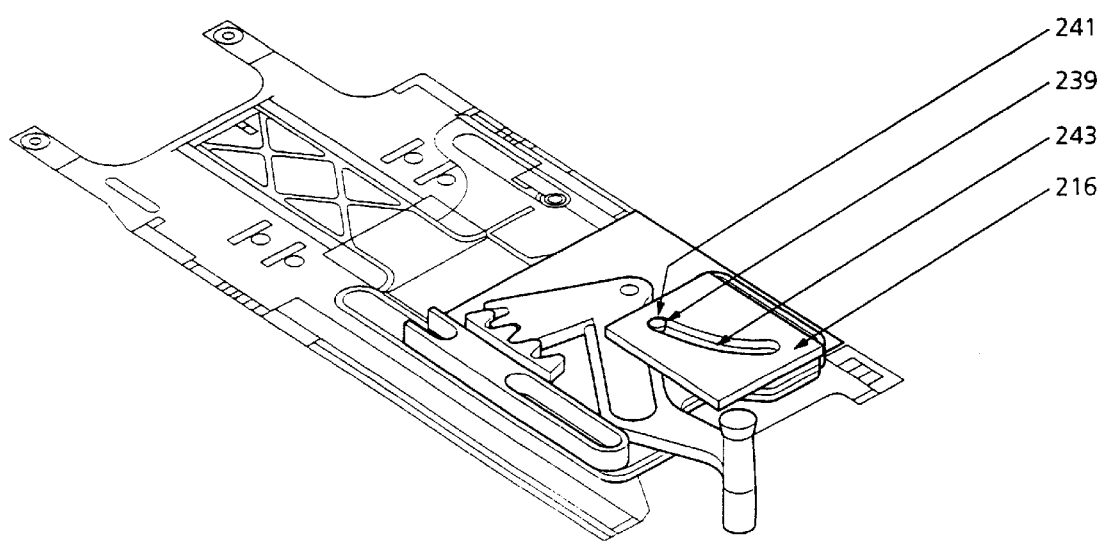
FIG. 3 shows the components of FIG. 2 supplemented by a cam plate and with the actuating lever of the apparatus moved to a second position.

The arrangement is generally as shown in FIG. 1 except that the lever 234 is in two parts. Portion 235 of the lever is pivoted to the tray and bears a quadrant gear 244 in engagement with a toothed rack 232 on the sliding carriage as before. However, a second portion of 237 of the lever bearing an actuating member 238 and a roller 242 is mounted for sliding movement on the first portion 235 of the lever so that the length of the lever is variable. A cam follower pin 239 is provided on the second portion 237 of the lever. As shown in FIG. 3, the cam follower pin 239 is received in a slot 243 forming a cam profile in the underside of the tray floor 216 (only a portion shown) overlying the lever 234. The slot 243 in the underside of the tray floor 216 is so shaped that when the lever 234 is in its first position (as far to the right as possible in the drawing) the lever is fully extended, but as the lever is moved to the left towards to its second position, the cam and cam follower arrangement constrains the second portion 237 to slid down the first portion 235 of the lever to contract the lever. The effect of this is that the roller 242 moves towards the interior of the bay to a greater extent than would be obtained simply by the pivoting of the lever 234 if it were of constant length. A disc drive placed in the bay is therefore driven by the roller 242 into the bay to a greater extent for the given lever movement than would otherwise be obtained. The cam profile slot has at its rearward end a notch 241 into which the pin 239 drops to retain the drive in its plugged position.

Figure 4:
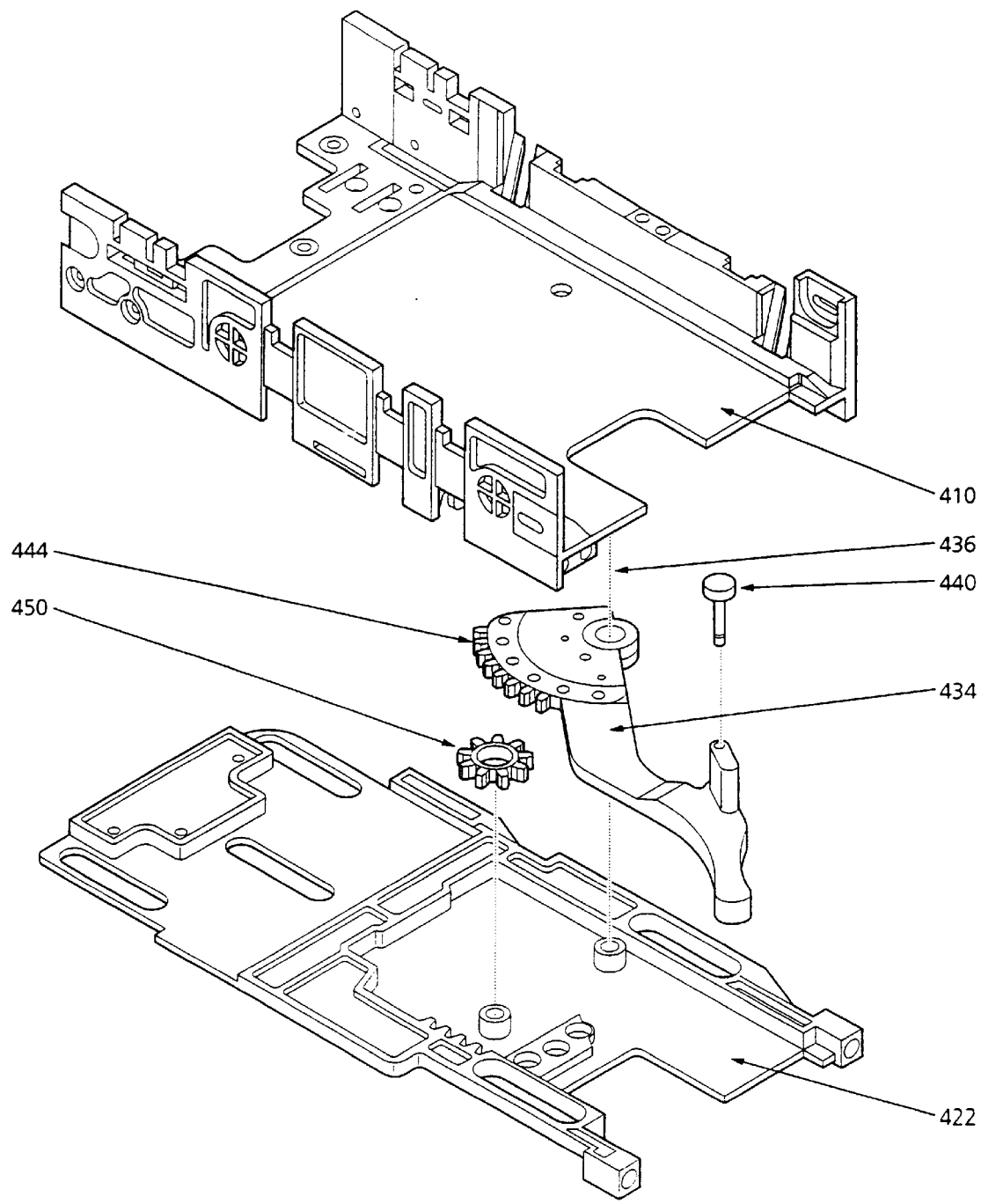
FIG. 4 shows an exploded view of a third embodiment of apparatus according to the invention.
Figure 5:
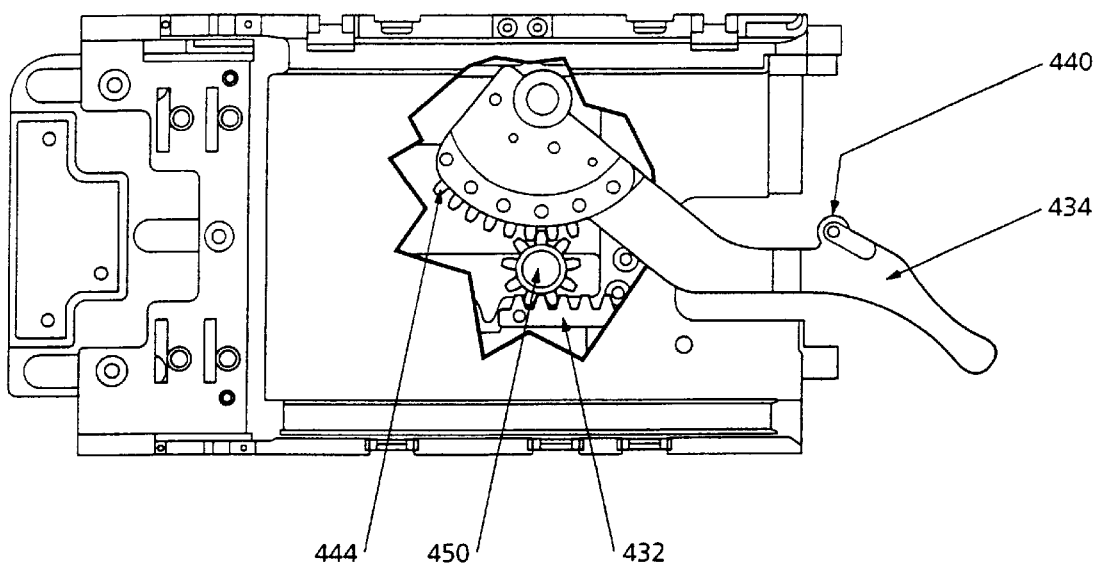
FIG. 5 shows the apparatus of FIG. 4 in plan view partially cut away to reveal interior components.

In the embodiment shown in FIGS. 4 and 5, the lever 434 is pivoted about an axis 436 not to the fixed portion of the tray but to the sliding carriage 422. The toothed rack 432 is now provided fixed on the underside of the tray 410 and an idler gear 450 is interposed between the quadrant gear 444 of the lever and the toothed rack 432. The idler gear is also mounted for rotation about an axis fixed with respect to the sliding carriage. Clockwise movement of the lever 434 produces anticlockwise movement of the idler gear 450 causing it to roll to the left along the track 432 driving the carriage further into the bay and carrying with it the lever 434 so that once again the movement inwards towards the bay of the roller 440 is greater than would be obtained simply by the pivoting of the lever 434 about a fixed pivot as in FIG. 1. The carriage is retained in its fully in position by a dog and detent arrangement similar to that shown in FIG. 1 (components 46, 48).

It is a further advantage of the mechanism illustrated in FIGS. 4 and 5 that the mechanism provide mechanical advantage both during insertion of the drive into the bay and for the ejection of the drive by the action of the ejection pin.

In both the second and third embodiments illustrated, the movement of the sliding carriage is connected to move the ejection pin forwards and backwards in contact with the back face of the disc drive as in the embodiment of FIG. 1.

It will be appreciated that whilst the invention has been described with reference to the specific embodiments illustrated, many variations and modifications thereof may be made within the scope of the invention.

What is claimed is:

1. A bay for receiving an electrical device having a rearwardly facing electrical connector, a rearwardly facing abutment surface, and a forwardly facing abutment surface, said bay comprising a front aperture for receiving a said electrical device, a rear portion having an electrical connector for connecting to the electrical connector of said electrical device, a sliding carriage bearing an ejection member having a forwardly facing abutment surface for engagement with the rearwardly facing abutment surface of the electrical device, said carriage being mounted for sliding movement in the bay, and a lever operated insertion and removal mechanism for the insertion and later removal of said electrical device, said mechanism comprising a pivoted lever having a manually engageable actuating portion, an abutment member carried by the lever for engagement with the forwardly facing abutment surface of the electrical device, and a rotary gear member driven by said lever and operatively coupled to the sliding carriage, whereby said lever is pivotable from a first position in which said front aperture of the bay is open for receiving said electrical device and said carriage is slid forwardly, via intermediate positions in which said carriage and said ejection member are driven progressively rearwardly by the action of said rotary gear member and the abutment member of the lever bears against the front abutment surface of the electrical device to push said device into said bay, to a second position in which said carriage is driven fully rearwardly and said device is brought to a position in the bay where the electrical connector of the device connects to the electrical connector of the bay, and whereby the electrical device can be ejected from the bay by reversal of the movement of said lever from said second position to said first position to drive said carriage forwards in the bay with said ejection member bearing against the rearwardly facing abutment surface of the device to drive the device out of the bay.

2. A bay as claimed in claim 1, wherein the abutment surface of the lever is provided on a roller mounted for rotation on said lever.

3. A bay as claimed in claim 1, wherein said rotary gear member is rotated by said lever and is engaged with a toothed rack on said carriage.

4. A bay as claimed in claim 1, comprising a detent mechanism acting to retain the lever in the second position.

5. A bay as claimed in claim 1, wherein the distance between said abutment surface of the lever and the pivot of the lever is constant.

6. A bay as claimed in claim 1, wherein a mechanism is provided for shortening the distance from the abutment surface of the lever to the pivot of the lever progressively as the lever is moved from said first position to said second position.

7. A bay as claimed in claim 6, wherein said lever comprises a first portion which is mounted for said pivoting movement and a second portion carried by the first portion for movement with respect thereto to extend and contract said lever and bearing a cam follower, and wherein the bay comprises a fixed cam engaged with said cam follower, the cam being shaped such that in said first position, the lever is extended and when moved through said intermediate positions to said second position the second portion of the lever is constrained to move with respect to the first portion to progressively contract said lever.

8. A bay as claimed in claim 1, wherein the lever is pivoted on the sliding carriage, a toothed rack is provided which is fixed with respect to said electrical connector of the bay and said rotary gear member is rotated by said lever and is in geared engagement with said rack such that pivoting of said lever from said first position to said second position drives said carriage toward the back of said bay.

9. Apparatus for testing an electrical device, comprising a bay as claimed in claim 1 for receiving an electrical device for testing.

10. Apparatus as claimed in claim 9, wherein said apparatus contains at least ten said bays.

11. Apparatus as claimed in claim 10, wherein said apparatus contains at least fifty said bays.

12. A method of testing the operation of a computer disc drive comprising inserting the drive into the or a bay of apparatus as claimed in claim 9 and conducting electronic tests on the drive.

* * * * *